(12) United States Patent
Garg et al.

(10) Patent No.: US 11,366,672 B2
(45) Date of Patent: Jun. 21, 2022

(54) OPTIMIZATION OF APPLICATION LEVEL PARALLELISM

(71) Applicant: Synopsys, Inc., Mountain View, CA (US)

(72) Inventors: Amit Garg, Bengaluru (IN); Shripad Deshpande, Bengaluru (IN); Amit Tara, Bengaluru (IN)

(73) Assignee: Synopsys, Inc., Mountain View, CA (US)

( * ) Notice: Subject to any disclaimer, the term of this patent is extended or adjusted under 35 U.S.C. 154(b) by 254 days.

(21) Appl. No.: 16/545,871

(22) Filed: Aug. 20, 2019

(65) Prior Publication Data
US 2020/0065114 A1 Feb. 27, 2020

(30) Foreign Application Priority Data
Aug. 21, 2018 (IN) .............................. 201811031206

(51) Int. Cl.
| | | |
|---|---|---|
| G06F 9/44 | (2018.01) | |
| G06F 9/38 | (2018.01) | |
| G06F 9/54 | (2006.01) | |
| G06F 11/30 | (2006.01) | |
| G06F 30/20 | (2020.01) | |
| G06F 11/34 | (2006.01) | |

(52) U.S. Cl.
CPC ............ *G06F 9/3885* (2013.01); *G06F 9/544* (2013.01); *G06F 11/3086* (2013.01); *G06F 11/3457* (2013.01); *G06F 30/20* (2020.01)

(58) Field of Classification Search
CPC ....................................................... G06F 30/20
See application file for complete search history.

(56) References Cited

U.S. PATENT DOCUMENTS

| | | | |
|---|---|---|---|
| 7,475,000 B2 | 1/2009 | Cook et al. | |
| 2014/0013313 A1* | 1/2014 | Eker ........................ | G06F 8/33 717/132 |

(Continued)

FOREIGN PATENT DOCUMENTS

| | | | | |
|---|---|---|---|---|
| CN | 102053945 A | 5/2011 | | |
| WO | WO-2012067688 A1 * | 5/2012 | ............... | G06F 9/50 |

*Primary Examiner* — Hang Pan
(74) *Attorney, Agent, or Firm* — Sterne, Kessler, Goldstein & Fox P.L.L.C.

(57) ABSTRACT

A system including a user interface, a memory, and a processor configured to perform operations stored in the memory is disclosed. The operations may include receiving an application specification including an application algorithm, and extracting from the application algorithm a first and a second node. The first node may include a first component of the application algorithm, and the second node may include a second component of the application algorithm that may be different from the first component. The operations may include analyzing execution dependency of the first node on the second node. The analyzing execution dependency may include analyzing computational requirements, bandwidth requirements, and input trigger requirements of the first node and the second node based on parallelism of available resources. The operations may include determining and simulating a plurality of application execution paths on a computational platform for generating a report including an analysis of the application algorithm.

20 Claims, 8 Drawing Sheets

(56) References Cited

U.S. PATENT DOCUMENTS

2017/0286342 A1* 10/2017 Derler .................. G06F 9/5066
2019/0057173 A1 2/2019 Ventroux et al.
2019/0196672 A1* 6/2019 Mikheev ................ G06F 16/26

* cited by examiner

OPTIMIZATION OF APPLICATION LEVEL PARALLELISM

CROSS-REFERENCE TO RELATED APPLICATIONS

The present application claims the benefit of Indian Patent Appl. No. 201811031206, filed on Aug. 21, 2018, which is incorporated herein by reference in its entirety.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

SPECIFICATION—DISCLAIMERS

In the following Background, Summary, and Detailed Description, paragraph headings do not signify limitations. In these writings, the citation or identification of any publication signifies neither relevance nor status as prior art. Many paragraphs in this disclosure are common to multiple Synopsys patent specifications.

FIELD(S) OF TECHNOLOGY

The following information is solely for use in searching the prior art. This disclosure has significance in the field of electronics in general, including the following topics: application modeling framework to assess temporal and spatial parallelism using an abstract representation of the application from high level application design.

BACKGROUND

Ever growing complexity of software content in electronic systems is imposing an ever increasing requirement in terms of compute and memory I/O bandwidth required by the software to deliver the requisite functionality. This coupled with the physical limits reached in terms of how fast the circuits can be clocked to deliver higher performance, is posing a unique challenge in terms of exploiting the parallelism in the application such that the work can be divided in smaller parallel chunks which can be executed over multiple parallel machines and thus deliver higher performance by division of labor.

The advent of above paradigm is more than a decade old and the initial thrust had been to divide the existing applications such that they could exploit the parallel nature of resources available for compute. With ever increasing availability of compute and resources on the Silicon Especially Systems on a Chip which are comprised of multiple general purpose cores and dedicated accelerators designers are constantly looking at developing new applications to deliver more functionality. One of the challenges for these new applications to be developed is to understand what is the level of parallelism that can be designed to allow flexibility for it to execute on different target environments in an efficient manner.

Other researchers in the art have studied the several approaches. For instance, "Using HPX and LibGeoDecomp for Scaling HPC Applications on Heterogeneous Supercomputers," describes an HPX model that is based on principles of the ParalleX execution model to enable a maximum of application-level parallelism while minimizing the effect of the slow factors. The model includes a simulation method which takes different computation speeds of the various processing units involved in the simulation. The HPX block is able to create a varying number of UpdateGroup components per node based on the computational requirements of a specific node. However, HPX is a framework based on execution of actual software for High Performance computing, and requires availability of fully functional S/W stack as a pre-requisite.

Another paper titled "WavePipe: Parallel Transient Simulation of Analog and Digital Circuits on Multi-Core Shared-Memory Machines," describes a coarse-grained application-level parallel approach named WavePipe to achieve good parallel processing efficiency by overcoming the high inter-core/thread communication overhead in fine-grained parallel approaches. WavePipe exploits application-level parallelism along the time axis by simultaneously computing the circuit solutions at multiple adjacent time points using a combination of backward and forward pipelining schemes. In other words, this reference discusses parallelizing a circuit level simulator.

Another paper titled "Parallel Simulation of Queueing Petri Net Models," describes a method of exploiting parallelism on application level means to run a set of sequential simulation programs on a different processor. This application-level parallelism supports multiple analysis approaches which are: replication/deletion that runs independent short replications each of length observation, a batch/means performs one long run & divides into batches for analysis and a method of Welch uses multiple runs to determine initialization bias. Similar to other references described above, this reference also discusses parallelizing a simulator.

Accordingly, there is no current technology that allows assessment of the application design that starts at a high level as a set of data flow and data abstraction diagrams like UML diagrams.

SUMMARY

This Summary is a prelude to the Detailed Description. This Summary, together with the independent Claims, signifies a brief writing about at least one claimed invention (which can be a discovery, see 35 USC 100(a); and see 35 USC 100(j)), for use in commerce that is enabled by the Specification and Drawings.

The claims signify a brief description of one or more of the innovations, embodiments, and/or examples found within this disclosure.

This disclosure describes a computerized system for application modeling framework that includes a user interface, a memory configured to store operations, and one or more processors configured to perform the operations including receiving, via the user interface, an application specification including an application algorithm. The one or more processors are further configured to perform operations including extracting from the application algorithm a first node and a second node. The first node may include a first component of the application algorithm, and the second node may include a second component of the application algorithm, and the first component may be different from the second component. The one or more processors are further configured perform operations including analyzing execution dependency of the first node on the second node including analyzing computational requirements, bandwidth requirements, and input trigger requirements of the first node and the second node on parallelism of available resources. The one or more processors are further configured perform operations including determining a plurality of application execution paths based on the analyzed execution dependency for the first node and the second node. The one or more processors are further configured perform operations including simulating the plurality of application execution paths on a computational platform configured based on input received via the user interface, and generating a report for display. The report may include an analysis of the application algorithm based on simulation of the plurality of execution paths on the computational platform on the parallelism of the available resources.

This disclosure also describes a method for application modeling. The method includes receiving, at one or more computing devices, an application specification including an application algorithm. The method steps being performed by the one or more computing devices, and may include extracting a first node and a second node from the application algorithm. The first node may include a first component of the application algorithm, and the second node may include a second component of the application algorithm. The first component may be different from the second component. The method may also include analyzing execution dependency of the first node on the second node comprising analyzing computational requirements, bandwidth requirements, and input trigger requirements of the first node and the second node on parallelism of available resources. The method may further include determining a plurality of application execution paths based on the analyzed execution dependency for the first node and the second node. The method may also include simulating the plurality of application execution paths on a computational platform, and generating a report for display. The report may include an analysis of the application algorithm based on simulation of the plurality of execution paths on the computational platform on the parallelism of the available resources. The computational platform may be configured based on input received via a user interface.

This disclosure also describes a non-transitory computer-readable device having instructions stored thereon that, when executed by at least computing device, causes the at least one computing device to perform operations including receiving an application specification that includes an application algorithm, and extracting a first node and a second node from the application algorithm. The first node may include a first component of the application algorithm, and the second node may include a second component of the application algorithm. The first component may be different from the second component. The operations may also include analyzing execution dependency of the first node on the second node comprising analyzing computational requirements, bandwidth requirements, and input trigger requirements of the first node and the second node on parallelism of available resources. The operations may further include determining a plurality of application execution paths based on the analyzed execution dependency for the first node and the second node. The operations may further include simulating the plurality of application execution paths on a computational platform. The computational platform may be configured based on input received via a user interface. The operations may also include generating a report for display. The report may include an analysis of the application algorithm based on simulation of the plurality of execution paths on the computational platform on the parallelism of the available resources.

This Summary does not completely signify the claimed inventions. This Summary (as well as the Abstract) neither signifies essential elements of, nor limits the scope of, the claimed inventions enabled by the Specification and Figures.

DRAWINGS

The following Detailed Description, Figures, and Claims signify the uses and advantages of the claimed inventions, and their embodiments. All of the Figures are used only to provide knowledge and understanding and do not limit the scope of the claimed inventions and their embodiments. Such Figures are not necessarily drawn to scale.

Similar components or features used in the Figures can have the same, or similar, reference signs in the form of labels (such as alphanumeric symbols, e.g., reference numerals), and can signify a similar or equivalent use. Further, various components of the same type can be distinguished by following the reference label by a dash and a second label that distinguishes among the similar components. If only the first reference label is used in the Specification, its use applies to any similar component having the same first reference label irrespective of the second reference label. A brief description of the Figures is below.

In the Figures, reference signs can be omitted as is consistent with accepted engineering practice; however, a skilled person will understand that the illustrated components are readily understood when viewed in the context of the illustration as a whole and the accompanying disclosure describing such various figures.

DETAILED DESCRIPTION

The Figures and Detailed Description signify, only to provide knowledge and understanding, the claimed inventions. To minimize the length of the Detailed Description, while various features, structures or characteristics can be described together in a single embodiment, they also can be used in other embodiments without being written about. Variations of any of these elements, and modules, processes, machines, systems, manufactures or compositions disclosed by such embodiments and/or examples are easily used in commerce. The Figures and Detailed Description also can signify, implicitly or explicitly, advantages and improvements of the claimed inventions and their embodiments for use in commerce.

In the Figures and Detailed Description, numerous specific details can be described to enable at least one embodiment of the claimed inventions. Any embodiment disclosed herein signifies a tangible form of a claim invention. To not obscure the significance of the embodiments and/or examples in this Detailed Description, some elements that are known to a skilled person can be combined together for presentation and for illustration purposes and not be described in detail. To not obscure the significance of these embodiments and/or examples, some well-known processes, machines, systems, manufactures or compositions are not written about in detail. However, a skilled person can use these embodiments and/or examples in commerce without these specific details or their equivalents. Thus, the Detailed Description focuses on enabling the distinctive elements of the claimed inventions and exemplary embodiments. Where this Detailed Description refers to some elements in the singular tense, more than one element can be depicted in the Figures and like elements are labeled with like numerals.

Detailed Description—Exemplary Method for Application Modeling Framework

Figure 1:
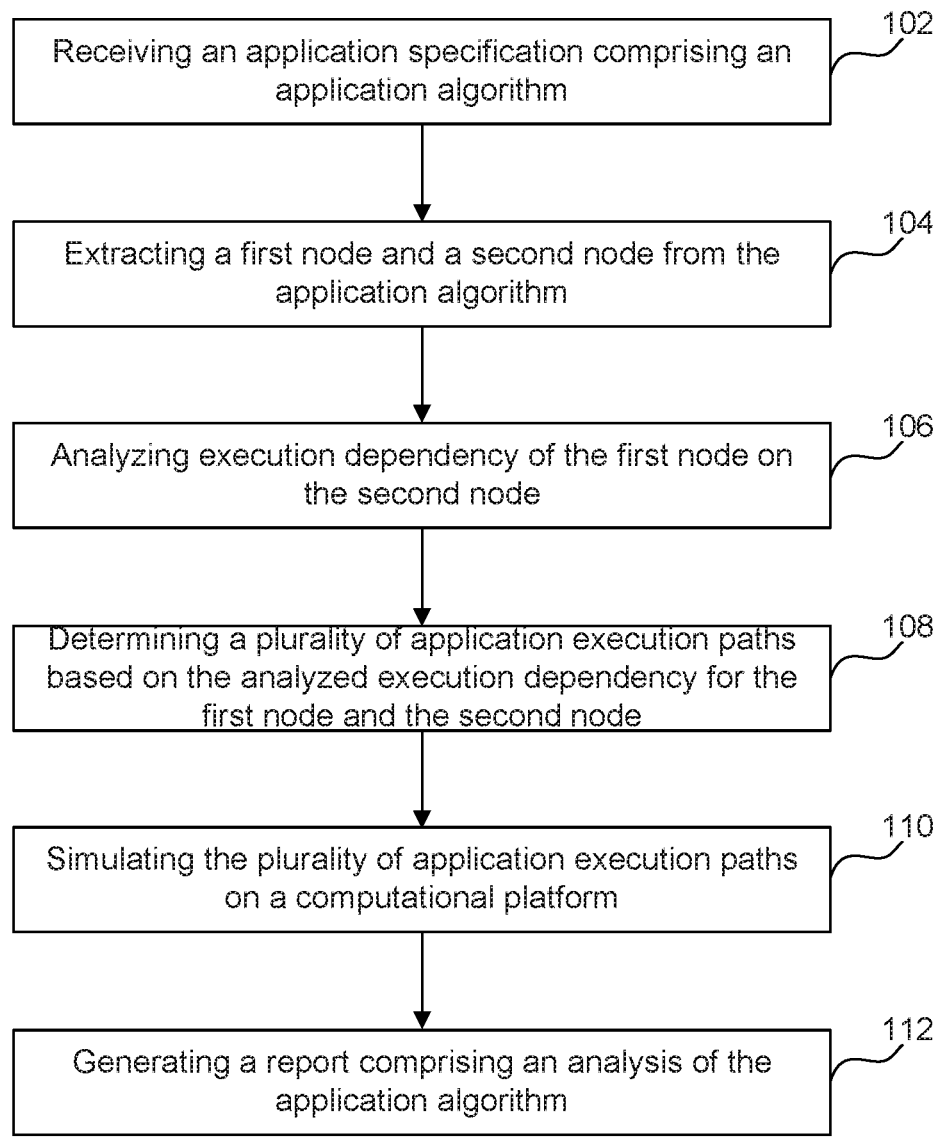
FIG. 1 illustrates the flow chart for implementing a framework, according to an exemplary embodiment of the present disclosure.

FIG. 1 is a flow chart for implementing an application modeling framework, according to an exemplary embodiment of the present disclosure. As illustrated in FIG. 1, at step 102, an application specification including an application algorithm may be received via a user interface. The user interface may include a graphical user interface (GUI), and a command line interface (CLI). The user interface may be an interface over a TCP/IP, a UDP, and/or a FTP protocol. The user interface may be implemented over a secure network, for example, using an IPSec, and/or SSH. The application specification may include an application algorithm. The application algorithm may represent a blueprint of the structures and operations of a software application. The application algorithm may be presented as design patterns including a class diagram, a unified modeling language diagram, a flow chart, and/or an enterprise architecture diagram. As known to a person skilled in the art, these design patterns may be used to capture data encapsulation and data flow of the application.

At step 104, a first node and a second node may be extracted from the application algorithm. The first node may include a first component of the application algorithm, and the second node may include a second components of the application algorithm. The first component may be different from the second component. An application algorithm may include a plurality of nodes, and each node of the application algorithm may represent a logical block. However, for clarity, only the first node and the second node are used as representative of the plurality of nodes. Each node, including the first node and the second node, may represent a part of the execution flow of the application algorithm. Each logical block or node of the application algorithm may identify key pieces of the functionality, which may be represented by logical grouping of functionality similar to key nodes in a data flow diagram of the application. Such data flow diagrams are a common design pattern that may be employed during early design cycle of the application to architect the application flow. Accordingly, each node or the logical block when stitched together may represent the application processing flow as a graph, which represents the application algorithm and may be referred as an application graph in this disclosure.

Each node, including the first node and the second node, may also be referred as a task node in this disclosure, since each node may represent a task of the application for execution. By way of non-limiting example, each node may represent a function, a class, and/or a library, which is a components of the application algorithm. The function may be implemented using any computer programming language such as C, C++, java, perl, python, etc. Similarly, the class may be implemented using any object oriented programming languages such as C++, java, python, etc. The library may be an application framework, a dynamically linked library, a static library, etc., and may be invoked by the function and/or the class. Each node, including the first and the second node, may have computational requirements and bandwidth requirements associated with the execution of the node. In other words, each node carries with it the requisite amount of work to be specified in terms of computational and input-output (I/O) requirements.

Each node may be identified by a name, which may be a name of the function, a name of the class, and/or a name of the library corresponding to the node. Each node, therefore, may correspond to computational work and may be represented by a unit of work. Each unit of work specified by the node is executed as an atomic unit of work and the amount of time needed to process the unit of work is a function of a simulation framework, described in detail below. Each node is an independent entity that is executed based on meeting its execution pre-requisites that are captured as zero or more inputs to the node. Each node is a schedulable and runnable entity in the simulation framework. Each node at the end of its execution produces 0 or more output tokens which can be used as triggers to the subsequent nodes, also referenced as downstream nodes, in the application.

By way of non-limiting example, a node, that is a C-language function may take as an execution pre-requisites, for example, two arguments, and upon execution of the node may produce an output variable of a type integer. Here, the two arguments may represent inputs to the node, that when gets executed in the simulation framework, may produce one output token, i.e., the output variable of the type integer. A person skilled in the art may have known that in an application algorithm, a function is defined or declared specifying its name, a number of argument(s) required as an input, and a number of output variable(s) generated as a result of execution of the function.

At step 106, execution dependency of the first node on the second node may be analyzed. Analyzing the execution dependency of the first node on the second node may include analyzing computational requirements, bandwidth requirements, and input trigger requirements of the first node and the second node based on parallelism of available resources.

Each node is an independent entity that is executed based on meeting its execution pre-requisites that are captured as zero or more inputs to the node. Accordingly, various inputs on which each node is dependent may be logically grouped in various combinations. This may be required to model application artifacts where a node may be executed under varying combinations. By way of non-limiting example, there may be an operation that necessarily must be executed if and only if all preceding nodes have executed and have produced the requisite number of input tokens required for a node associated with the operation. The other possibility is to trigger the downstream node once the requisite number of tokens are available, irrespective of which preceding node is producing them or any arbitrary combination of the two possibilities above. In addition, the framework allows for more arbitrary combination of the two possibilities mentioned above by aggregation of basic building blocks of all or either, mentioned above. By way of non-limiting example, the input trigger requirements of the node may be specified a logical AND and/or logical OR operation of input tokens. Accordingly, for construction of arbitrary execution topology of the application graph, logical aggregation of the edges may be used to specify the input trigger to the node. This combination is atypical of any graph representation.

As described above, each node, including the first node and the second node, require specific number of input arguments or input tokens for execution of the node. The input tokens required for the execution of the node correspond to the input trigger requirements. Further, as described herein, one node's output token or output variables may be an input argument or input token for the other node. Therefore, there is dependency of one node on the other node in terms of input trigger requirements.

Further, execution dependency of one node on the other node based on input trigger requirements may be in form of multi-rate dependency in the execution order of the various nodes in the application flow. Each node produces on each of its invocation a number of output tokens, and each downstream node may be annotated with the number of tokens required from the corresponding upstream node to qualify as its input dependencies. This dependencies may be represented or annotated as part of the application graph specification with each edge of the graph annotated with the number of tokens the upstream node must produce and number of tokens the downstream node must qualify as meetings its input requirements. Multi-rate token dependency may allow for variable number of executions of the nodes. The token rates may be specified in an abstract form for modeling of the application algorithm, and values for the tokens are not required for creation of the functional model of the application algorithm. Further, the computing power may be allotted or shared among various nodes and their execution, and based on the number of operating cycles required for each upstream node to produce number of tokens required to qualify to meet input token requirements of each downstream node, execution dependency of each node may be determined/analyzed based on the computational requirements, the bandwidth requirements, and the input trigger requirements, as described herein.

Each node require for its execution computational resources, which may be referenced as computational requirements, and input-output resources, which may be referenced as bandwidth requirements of the node.

Each node may be annotated with a normalized representation of the compute load required to perform various logical and arithmetic operations as part of the behavior of the application that must be executed. The application designer may specify the number of cycles required for the execution of the each node in the application specification. The computational requirements may be presented or annotated either as number of cycles with respect to a normalized execution unit or can be specified as a statistical model of various execution groups that will comprise the node. The compute load may be based either on a high level assessment of the node flow or may be captured from snippets of the pseudo-code needed for the node execution. Therefore, the application designer is not required to specify an exact number of cycles required for the execution of the node. Annotation of computational requirement of each node of the application algorithm may be successively refined to allow for adding details to the model as the application development progresses. As a result of analysis of the computation requirements of each node, computational requirements of each node may be updated based on various artifacts such as implicit memory accesses for instruction and algorithm data that may be performed as a by-product of executing the algorithm on any programmable device. These artifacts of the each node may be annotated to each node as a result of analysis. Further, the computational requirement specified for each node when combined together during execution may play an important role on parallel usage of available computing resources, such as, central processing unit (CPU) cores. Execution of the first node and the second node by a specific thread or different thread, and allocation of CPU cores and threads may also affect parallel usage of the available resources.

Each node usually carries with it some amount of memory I/O traffic which is typical of most application S/W. This is the explicit memory I/O that the node must execute to fetch the data it processes to produce the resultant output data. Each node may be annotated with bandwidth requirements specified in terms of memory I/O required for data that must be fetched and then written back as output. This aspect of application modeling is critical as the overall data latencies have a significant impact on the overall parallelism that may be exercised in the application. Most applications process data in a pipeline fashion and if the application has multiple iterations, which is typical of most applications, then the level of parallelism that can be achieved may be critically impacted by how this external data needed for application execution is fetched.

As described above, each node requires certain number of data being read and/or written from the memory. The application designer may specify input-output or bandwidth requirements in terms of number of bytes being read from or written to memory. Bandwidth requirements, which may also be referenced as, an external I/O data requirements in this disclosure, may be represented or annotated as a statistical model where the amount of data is specified in a blob of read and write requests that must be performed from various memory addresses. A memory may include a local memory, network memory, a shared memory, a message queue, and/or a pipe. Depending on the type of the memory being used for input-output by the node, additional synchronization may be required among various nodes for memory access, which may affect parallel usage of the available resources. Additional synchronization required for memory access may also cause delay and backpressure during execution of nodes in a chain or hierarchy.

Further, determination of execution dependency may be dependent upon token transportation from the producer or upstream node to the consumer or downstream node. Token may be transported over communication channel that may, for example, include a shared memory, a local memory, a network memory, a message queue, a pipe, etc. As a person skilled in the art may recognize that for transferring of data or token from one node to another node may depend on the context and usage of each node. The communication channel specified above may each differ in characteristics such as speed, synchronization requirements, throughput, etc. Accordingly, execution of each node may be dependent upon the communication channel used for transportation of token or data from the producer or upstream node to the consumer or downstream node.

The bandwidth requirements may also be annotated as a detailed trace specifying the exact address and data pattern. The bandwidth requirement may be annotated as an arbitrary combination of the blob of read and write requests and the detailed trace specifying the exact address and data pattern. Based on analysis of the bandwidth requirements annotated for each node, access latencies for each node may be identified, and effects of various memory access latencies on the application algorithm may be determined. Based on the analysis of the bandwidth requirements, the level of parallelism that may be achieved for different memory access latencies under ideal execution conditions may be determined. Under ideal execution conditions, there may be no contention in the memory access paths. Accordingly, an upper bound of the memory bandwidth requirement for maximum application parallelism may be established.

Therefore, based on the computational requirements, the bandwidth requirements, and the input trigger requirements annotated for each node, including the first node and the second node, execution dependencies of the first node and the second node may be analyzed.

As described in detail below, each node on its execution requests the simulation framework for the requisite computational and its associated memory I/O requirements. With the present technology, needed resources for node execution are provided and nodes under execution are aggregated.

At step 108, a plurality of application execution paths may be determined based on the execution dependency for the first node and the second node analyzed as described above with reference to step 106. As described above, execution of one node may be dependent upon other node(s) based on the computational requirements, the bandwidth requirements, and the input trigger requirements. Accordingly, there may be more than one way nodes may be grouped for execution in parallel based on the computational requirements, the bandwidth requirements, and the input trigger requirements, and the available resources that may be used in parallel. By way of non-limiting example, based on the analysis of the execution dependency for each node, and based on various computing and I/O resources available for parallel use for the given communication channel requirements for token transportation from a source or producer node to a destination or consumer node, a plurality of execution paths for execution of various nodes for achieving improved performance of parallelism may be determined.

At step 110, plurality of application execution paths determined at step 108 may be simulated on a computation platform. The computational platform may be configured based on input received from an application developer via the user interface. As described above, other application modeling frameworks or tools require an application protocol stack or an actual target machine for analysis of the application algorithm. However, as specified in this disclosure, actual target machine or an application protocol stack may not be required for simulation.

During this step 110, simulation of the application execution path may performed under ideal resource conditions, i.e., if the resource is available when needed and with specified capacity to model the normalized execution of the compute, and non-ideal resource condition, i.e., under restricted resource availability. A framework may be provided for modeling the execution time of the node based on the compute and its associated algorithmic I/O requirements.

For effective application modeling, all inter node or inter-task communication may be modeled using physical resources with definitive physical characteristics in the system. The communication between various nodes introduces a finite delay and may result in addition I/O traffic that is generated in the system based on how the inter-node communication channel is modeled. The system effects of the inter-node communication as part of the application modeling allow the application designer to bound the acceptable partitioning in the target system or may allow the application designer to improve specification of inter-node or inter-task communication channel characteristics that may be needed for exploiting the intended parallelism for which the application is being designed.

During simulation of the application execution paths, various inter-node communication channels may be explored and the effects of different communication channels on the parallelism of the application may be analyzed. So, in addition to the application execution being compute resource bounded or memory I/O bandwidth, the application executions paths may also be bounded by the inter-node channel characteristics. The inter-channel characteristics is another aspect of the exploration as it may be the governing factor in terms of the overall parallelism that is desired, given inter-node communication architecture.

Another aspect of channel architecture is the capacity and the backpressure, which channel architecture will impose on the parallelism. Backpressure refers to the buildup of data or input tokens at a node without producing an output variables or output tokens to one or more downstream nodes. Accordingly, the node in a chain of nodes may create a bottleneck and may restrict the parallel use of the resources. Accordingly, various channel architectures may be assessed for the optimum inter-node channel needed for optimizing the application architecture.

During the simulation of the application execution paths, the application developer may also provide application specification that further includes communication channel information and communication delay information via the user interface. As specified above, the communication channel information or communication channel may include one or more of a shared memory, a local memory, a network memory, a pipe, and/or a message queue, etc. As specified above, the type of communication channel used for token transportation may affect execution dependency for each node and may affect how each resource may be used in parallel. Accordingly, the application algorithm may be analyzed for its performance effects on capacity limitation and backpressure imposed on the parallelism of the available resources based on the communication channel and/or under non-ideal resource condition(s).

Additionally, the execution of each node is under ideal resource condition, however, an application designer may provide communication delay information to simulate or apply delay in execution of one or more nodes or inter-node communication. Additional delay may cause additional input-output traffic, and, therefore, may affect the parallel usage of the available resource.

The application developer may also provide restrictions on the computational power and I/O bandwidth available during simulation to analyze effects of critical bounds of the computational power and/or I/O bandwidth. Accordingly, the application developer may perform simulation to perform trade-off analysis between the increased concurrent I/O traffic for higher parallelism, which may be referenced as lower per node computing, and lower concurrent I/O traffic for reduced parallelism, which may be referenced as higher per node computing.

At step 112, based on the simulation of a plurality of application execution paths on the computational platform, a report including an analysis of the application algorithm may be generated. The report may specify detailed analysis and in-depth visualization of the execution of the application algorithm, as a whole and for each specific node or a grouping of nodes, to identify hot spots or nodes that are bottleneck for an optimized parallel usage of available I/O and computational resources. Accordingly, the generated report may also include suggestions of nodes that may be broken into smaller pieces to achieve more fine grain functionality. This may be achieved based on analysis of the input trigger requirements of each producer node and consumer node, and specific communication channel information applied for token transportation from the producer node to the consumer node.

Detailed Description—Exemplary Task Node

Figure 2:
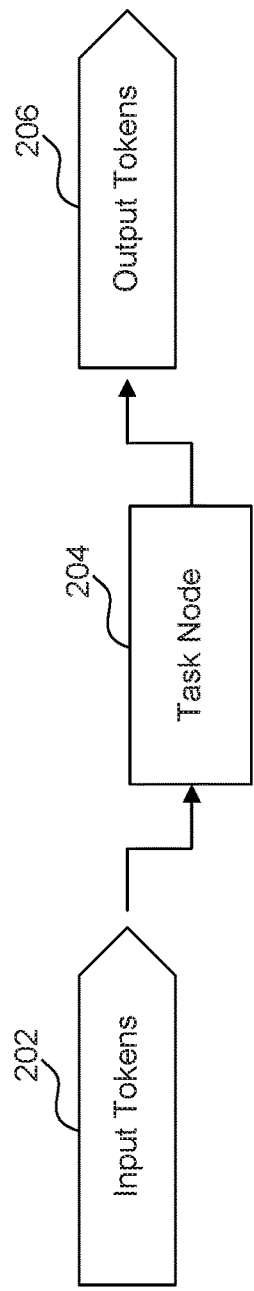
FIG. 2 illustrates consumption of input tokens and production of output tokens by a task node, according to an exemplary embodiment of the present disclosure.

FIG. 2 illustrates consumption of input tokens and production of output tokens by a task node, according to an exemplary embodiment of the present disclosure. Shown in FIG. 2 are a task node 204, input tokens 202, and output tokens 206. As described above, task node 202 may be a node extracted from the application algorithm at step 104. As described above, each node may represent a task of the application for execution, and, therefore, each node may be referenced as a task node. As described above, by way of non-limiting example, the task node 204 may be implemented using any computer programming language such as C, C++, java, perl, python, etc. Similarly, the class may be implemented using any object oriented programming languages such as C++, java, python, etc. The library may be an application framework, a dynamically linked library, a static library, etc., and may be invoked by the function and/or the class. As described above, each node or task node may have input trigger requirements before the task node may be executed. Input tokens 202 may specify the input trigger requirements for the task node 204, and the output tokens 206 may specify the output variables produced or generated as a result of execution of the task node 204.

Figure 3:
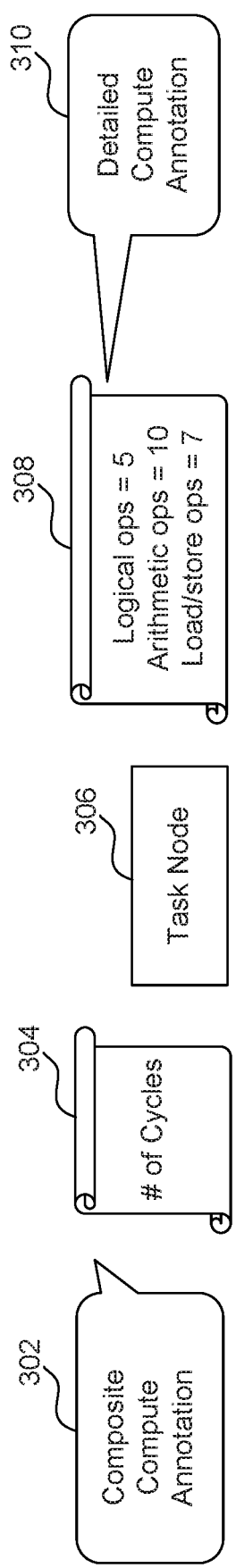
FIG. 3 illustrates the execution time of a task node and algorithmic requirements of a task node, according to an exemplary embodiment of the present disclosure.

Detailed Description—Exemplary Task Node Annotation for Computational Requirements FIG. 3 illustrates the execution time of a task node and algorithmic requirements of a task node, according to an exemplary embodiment of the present disclosure. Shown in FIG. 3 are a task node 306, that may be similar to the task node 204 described above. Further, as described above, each node may be annotated with the computational requirements of the node by the application designer. Application designer may annotate the task node 306 with composite compute annotation 302, which may include a normalized representation of the compute load required to perform various logical and arithmetic operations as part of the behavior of the application that must be executed. By way of non-limiting example, the normalized representation of the compute load required to perform various logical and arithmetic operations may be number of cycles 304 required for the execution of the task node 306.

As described above, annotation of the task node 306 for the number of cycles 304 may be based either on a high level assessment of the task node 306 flow or may be captured from snippets of the pseudo-code needed for the execution of the task node 306. Accordingly, the application designer is not required to specify an exact number of cycles required for the execution of the task node 306. As a result of analysis of the computation requirements of the task node 306, computational requirements of the task node 306 may be updated based on various artifacts such as implicit memory accesses for instruction and algorithm data that may be performed as a by-product of executing the algorithm on any programmable device. These artifacts may be annotated to the task node 306 as a result of the analysis as shown in FIG. 3 as detailed compute annotation 310. The detailed compute annotations 310 may include specific breakdown 308 of, for example, a number of logical, arithmetic, and/or load or store operations performed by the task node 306. The specific breakdown 308 may include other information as well that may be specific to the particular computational platform.

Figure 4:
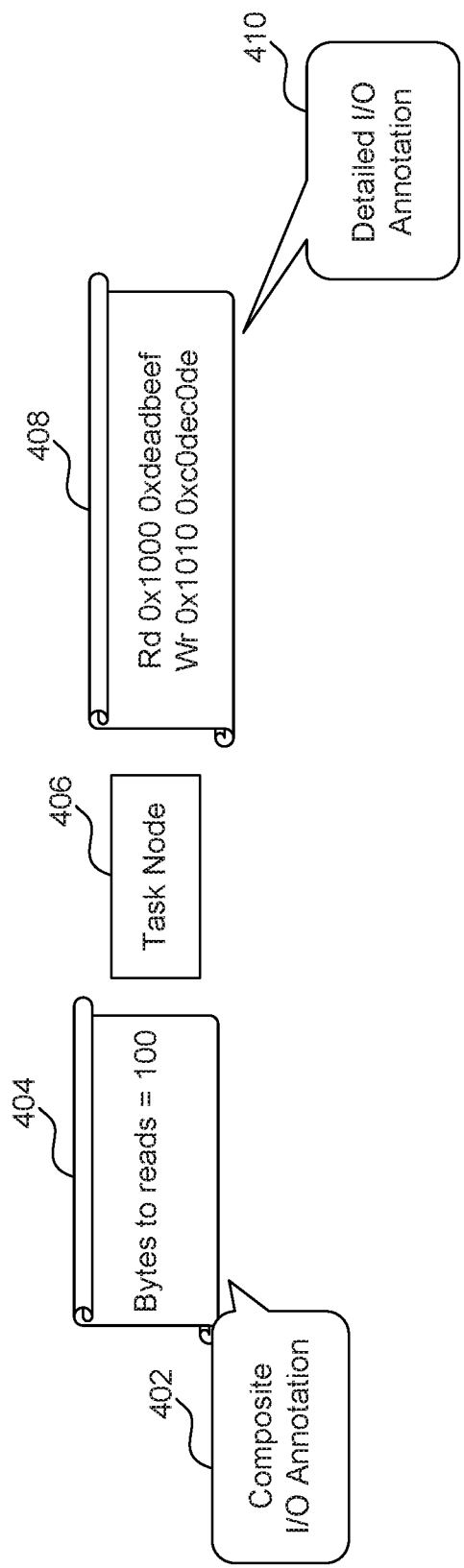
FIG. 4 illustrates memory characteristics of a task node, according to an exemplary embodiment of the present disclosure.
Figure 5:
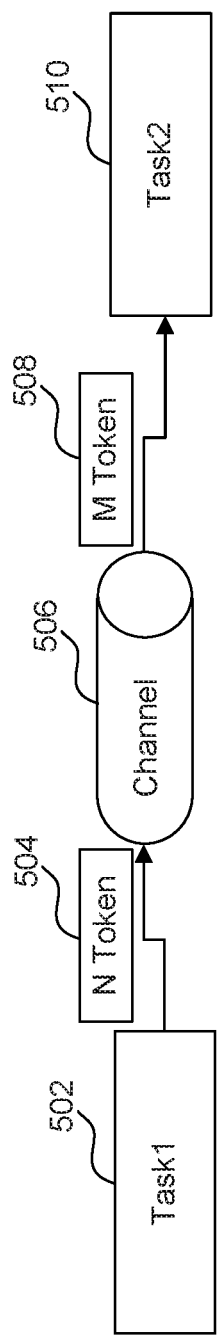
FIG. 5 illustrates multi-rate token dependency between a plurality of tasks, according to an exemplary embodiment of the present disclosure.

Detailed Description—Exemplary Task Node Annotation for Input-Output Requirements FIG. 4 illustrates memory characteristics of a task node, according to an exemplary embodiment of the present disclosure. Shown in FIG. 4 are a task node 406 that may be similar to the task node 204 or 306 described above. Further, as described above, each node may be annotated with the input-output (I/O) or bandwidth requirements of the node by the application designer. Application designer may annotate the task node 406 with composite I/O or bandwidth annotation 402, which may include a representation of amount of memory I/O traffic for the task node 406. By way of non-limiting example, the representation of the amount of I/O traffic may be a number of byte to read 404 during the execution of the task node 406. This is the explicit memory I/O that the task node 406 must execute to fetch the data it processes to produce the resultant output data. In addition, because of the execution of the task node on the computational platform as described, the task node may be further annotated with detailed I/O annotation 410 that may include statistics of any read or write errors, and statistics of data written to the memory as shown at 408. Further, as described above, this aspect of application modeling is critical as the overall data latencies have a significant impact on the overall parallelism that may be exercised in the application. Most applications process data in a pipeline fashion and if the application has multiple iterations, which is typical of most applications, then the level of parallelism that can be achieved may be critically impacted by how this external data needed for application execution is fetched Detailed Description—Exemplary Inter-Node Communication Dependency FIG. 5 illustrates multi-rate token dependency between a plurality of tasks, according to an exemplary embodiment of the present disclosure. Shown in FIG. 5 are two task nodes, task1 502 and task2 510, that communicates with each other over a channel 506. As shown in FIG. 5, task1 502 is a source or producer node and task2 510 is a destination of consumer node. The producer node may also be referenced as an upstream node and the consumer node may be referenced as a downstream node. Though only two nodes are shown here for clarity, there may be many nodes in a chain/stream; a node may be an upstream node and a downstream node both depending on the position in the stream.

As described above, each node requires a certain number of input tokens to meet the input trigger requirements for the execution of the node. The input tokens may be produced by another task node, and may be transported over a communication channel 506. As shown in FIG. 5, task2 510 requires m number of tokens 508 to meet input trigger requirements. The m number of token 508 may come from the output token 504 of the task1 502.

As described above, communication channel 506 may include a local memory, a network memory, a shared memory, a message queue, and/or a pipe. Depending on the type of the memory being used for input-output by the node, additional synchronization may be required among various nodes for memory access, which may affect parallel usage of the available resources. Additional synchronization required for memory access may also cause delay and backpressure during execution of nodes in a chain or hierarchy.

Detailed Description—Exemplary Logical Grouping of a Task Node

Figure 6:
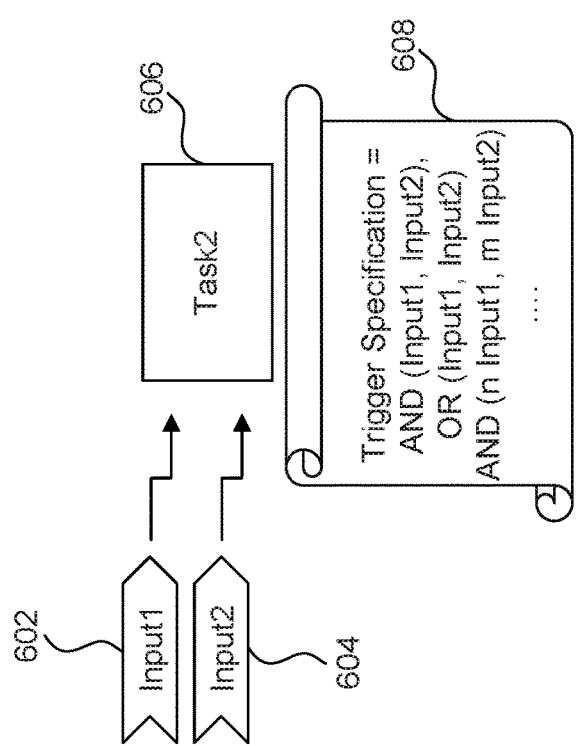
FIG. 6 illustrates logical groupings of input tokens, according to an exemplary embodiment of the present disclosure.

FIG. 6 illustrates logical groupings of input tokens, according to an exemplary embodiment of the present disclosure. Shown in FIG. 6 are task node task2 606, which may be similar to task node 204, 306, 406, and 506. The task node 606 may require input tokens input1 602 and input2 604 as input trigger requirements described above. Further, as shown in FIG. 6, input trigger requirements may be annotated for the task node as logically grouped combination of the input tokens at 608.

As described above, node 606 is an independent entity that is executed based on meeting its execution pre-requisites that are captured as inputs input1 602 and input2 604 to the node. Accordingly, various inputs on which task node 606 is dependent may be logically grouped in various combinations. This may be required to model application artifacts where a node may be executed under varying combinations. By way of non-limiting example, there may be an operation that may be executed if and only if all preceding nodes have executed and have produced the requisite number of input tokens required for a node associated with the operation. The other possibility is to trigger the downstream node once the requisite number of tokens is available, irrespective of which preceding node is producing them or any arbitrary combination of the two possibilities above. In addition, the framework allows for more arbitrary combination of the two possibilities mentioned above by aggregation of basic building blocks of all or either, mentioned above. By way of non-limiting example, the input trigger requirements of the node may be specified a logical AND and/or logical OR operation of input tokens. Accordingly, for construction of arbitrary execution topology of the application graph, logical aggregation of the edges may be used to specify the input trigger to the node. This combination is atypical of any graph representation.

Detailed Description—Technology Support from Data/Instructions to Processors/Programs Data and Information. While 'data' and 'information' often are used interchangeably (e.g., 'data processing' and 'information processing'), the term 'datum' (plural 'data') typically signifies a representation of the value of a measurement of a physical quantity (e.g., the current in a wire), or the answer to a question (e.g., "yes" or "no"), while the term 'information' typically signifies a structured set of data (often times signified by 'data structure'). A specified data structure is used to structure an electronic device to be used as a specific machine as an article of manufacture (see In re Lowry, 32 F.3d 1579 [CAFC, 1994]). Data and information are physical, for example binary data (a 'bit', usually signified with '0' and '1') enabled with two different levels of voltage in a circuit. For example, data can be enabled as an electrical, magnetic, optical or acoustical signal; a quantum state such as spin that enables a 'qubit'; or a physical state of an atom or molecule. All such data and information, when enabled, are stored, accessed, transferred, combined, compared, or otherwise acted upon, actions that require energy.

As used herein, the term 'process' signifies an unnatural sequence of physical actions and/or transformations (both also referred to as 'operations' or 'steps') to produce at least one result. The actions and transformations are technical applications of one or more natural laws of science or unnatural laws of technology. The actions and transformations often change the physical state of a machine, of structures of data and information, or of a composition of matter. Two or more actions can occur at about the same time, or one action can occur before or after another action, if they produce the same result. A description of the physical actions and/or transformations that comprise a process are often signified with a set of gerund phrases (or their semantic equivalents) that are typically preceded with the signifier 'the steps of' (e.g., "a process comprising the steps of measuring, transforming, partitioning and then distributing . . . "). The signifiers 'algorithm', 'method', 'procedure', '(sub)routine', 'protocol', 'recipe', and 'technique' often are used interchangeably with 'process', and 35 U.S.C. 100 defines a "method" as one type of process that is, by statutory law, always patentable under 35 U.S.C. 101. Many forms of knowledge, learning, skills and styles are authored, structured, and enabled—objectively—as processes—e.g., knowledge and learning as functions in knowledge programming languages. As used herein, the term 'rule' signifies a process with at least one conditional test (signified, e.g., by 'IF test THEN process'). As used herein, the term 'thread' signifies a sequence of operations or instructions that comprise a subset of an entire process. A process can be partitioned into multiple threads that can be used at or about at the same time.

As used herein, the term 'component' (also signified by 'part', and typically signified by 'element' when described in a patent text or diagram) signifies a physical object that is used to enable a process in combination with other components. For example, electronic components are used in processes that affect the physical state of one or more electromagnetic or quantum particles/waves (e.g., electrons, photons) or quasiparticles (e.g., electron holes, phonons, magnetic domains) and their associated fields or signals. Electronic components have at least two connection points to which are attached 'leads', typically a conductive wire or an optical fiber, with one end attached to the component and the other end attached to another component, typically as part of a circuit with current flows. There are at least three types of electrical components: passive, active and electromechanical. Passive electronic components typically do not introduce energy into a circuit—such components include resistors, memristors, capacitors, magnetic inductors, crystals, Josephson junctions, transducers, sensors, antennas, waveguides, etc. Active electronic components require a source of energy and can inject energy into a circuit—such components include semiconductors (e.g., diodes, transistors, optoelectronic devices), vacuum tubes, batteries, power supplies, displays (e.g., LEDs, LCDs, lamps, CRTs, plasma displays). Electromechanical components affect current flow using mechanical forces and structures—such components include switches, relays, protection devices (e.g., fuses, circuit breakers), heat sinks, fans, cables, wires, terminals, connectors and printed circuit boards. As used herein, the term 'netlist' is a specification of the components comprising an electric circuit, and electrical connections between the components. The programming language for the SPICE circuit simulation program is often used to specify a netlist. In the context of circuit design, the term 'instance' signifies each time a component is specified in a netlist.

One of the most important components as goods in commerce is the integrated circuit, and its res of abstractions. As used herein, the term 'integrated circuit' signifies a set of connected electronic components on a small substrate (thus the use of the signifier 'chip') of semiconductor material, such as silicon or gallium arsenide, with components fabricated on one or more layers. Other signifiers for 'integrated circuit' include 'monolithic integrated circuit', 'IC', 'chip', 'microchip' and 'System on Chip' ('SoC'). Examples of types of integrated circuits include gate/logic arrays, processors, memories, interface chips, power controllers, and operational amplifiers. The term 'cell' as used in electronic circuit design signifies a specification of one or more components, for example, a set of transistors that are connected to function as a logic gate. Cells are usually stored in a database, to be accessed by circuit designers and design processes.

As used herein, the term 'module' signifies a tangible structure for acting on data and information. For example, the term 'module' can signify a process that transforms data and information, for example, a process comprising a computer program. The term 'module' also can signify one or more interconnected electronic components, such as digital logic devices. A process comprising a module, if specified in a programming language, such as System C or Verilog, also can be transformed into a specification for a structure of electronic components that transform data and information that produce the same result as the process. This last sentence follows from a modified Church-Turing thesis, which is simply expressed as "Whatever can be transformed by a (patentable) process and a processor, can be transformed by a (patentable) equivalent set of modules.", as opposed to the doublethink of deleting only one of the "(patentable)".

A module is permanently structured (e.g., circuits with unalterable connections), temporarily structured (e.g., circuits or processes that are alterable with sets of data), or a combination of the two forms of structuring. Permanently structured modules can be manufactured, for example, using Application Specific Integrated Circuits ('ASICs') such as Arithmetic Logic Units ('ALUs'), Programmable Logic Arrays ('PLAs'), or Read Only Memories ('ROMs'), all of which are typically structured during manufacturing. For example, a permanently structured module can comprise an integrated circuit. Temporarily structured modules can be manufactured, for example, using Field Programmable Gate Arrays (FPGAs—for example, sold by Xilink or Intel's Altera), Random Access Memories (RAMs) or microprocessors. For example, data and information is transformed using data as an address in RAM or ROM memory that stores output data and information. One can embed temporarily structured modules in permanently structured modules (for example, a FPGA embedded into an ASIC).

Modules that are temporarily structured can be structured during multiple time periods. For example, a processor comprising one or more modules has its modules first structured by a manufacturer at a factory and then further structured by a user when used in commerce. The processor can comprise a set of one or more modules during a first time period, and then be restructured to comprise a different set of one or modules during a second time period. The decision to manufacture or implement a module in a permanently structured form, in a temporarily structured form, or in a combination of the two forms, depends on issues of commerce such as cost, time considerations, resource constraints, tariffs, maintenance needs, national intellectual property laws, and/or specific design goals. How a module is used is mostly independent of the physical form in which it is manufactured or enabled. This last sentence also follows from the modified Church-Turing thesis.

As used herein, the term 'processor' signifies a tangible data and information processing machine for use in commerce that physically transforms, transfers, and/or transmits data and information, using at least one process. A processor consists of one or more modules (e.g., a central processing unit, 'CPU'; an input/output ('I/O') controller, a memory controller, a network controller, and other modules). The term 'processor' can signify one or more processors, or one or more processors with multiple computational cores/CPUs, specialized processors (for example, graphics processors or signal processors), and their combinations. Where two or more processors interact, one or more of the processors can be remotely located. Where the term 'processor' is used in another context, such as a 'chemical processor', it will be signified and defined in that context.

The processor can comprise, for example, digital logic circuitry (for example, a binary logic gate), and/or analog circuitry (for example, an operational amplifier). The processor also can use optical signal processing, DNA transformations or quantum operations, microfluidic logic processing, or a combination of technologies, such as an optoelectronic processor. For data and information structured with binary data, any processor that can transform data and information using the AND, OR and NOT logical operations (and their derivatives, such as the NAND, NOR, and XOR operations) also can transform data and information using any function of Boolean logic. A processor such as an analog processor, such as an artificial neural network, also can transform data and information. No scientific evidence exists that any of these technological processors are processing, storing and retrieving data and information, using any process or structure equivalent to the bioelectric structures and processes of the human brain.

The one or more processors also can use a process in a 'cloud computing' environment, where time and resources of multiple remote computers are shared by multiple users or processors communicating with the computers. For example, a group of processors can use at least one process available at a distributed or remote system, these processors using a communications network (e.g., the Internet, or an Ethernet) and using one or more specified interfaces (e.g., an application program interface ('API') that signifies functions and data structures to communicate with the remote process).

As used herein, the term 'computer' and 'computer system' (further defined below) includes at least one processor that, for example, performs operations on data and information such as (but not limited to) the AND, OR and NOT logical operations using electronic gates that can comprise transistors, with the addition of memory (for example, memory structured with flip-flops using the NOT-AND or NOT-OR operation). Such a processor is Turing-complete and computationally universal. A computer can comprise a simple structure, for example, comprising an I/O module, a CPU, and a memory that performs, for example, the process of inputting a signal, transforming the signal, and outputting the signal with no human intervention.

As used herein, the term 'programming language' signifies a structured grammar for specifying sets of operations and data for use by modules, processors and computers. Programming languages include assembler instructions, instruction-set-architecture instructions, machine instructions, machine dependent instructions, microcode, firmware instructions, state-setting data, or either source code or object code written in any combination of one or more higher level languages, for example, the C programming language and similar general programming languages (such as Fortran, Basic, Javascript, PHP, Python, C++), knowledge programming languages (such as Lisp, Smalltalk, Prolog, or CycL), electronic structure programming languages (such as VHDL, Verilog, SPICE or SystemC), text programming languages (such as SGML, HTML, or XML), or audiovisual programming languages (such as SVG, MathML, X3D/VRML, or MIDI), and any future equivalent programming languages. As used herein, the term 'source code' signifies a set of instructions and data specified in text form using a programming language. A large amount of source code for use in enabling any of the claimed inventions is available on the Internet, such as from a source code library such as Github.

As used herein, the term 'program' (also referred to as an 'application program') signifies one or more processes and data structures that structure a module, processor or computer to be used as a "specific machine" (see In re Alappat, 33 F3d 1526 [CAFC, 1991]). One use of a program is to structure one or more computers, for example, standalone, client or server computers, or one or more modules, or systems of one or more such computers or modules. As used herein, the term 'computer application' signifies a program that enables a specific use, for example, to enable text processing operations, or to encrypt a set of data. As used herein, the term 'firmware' signifies a type of program that typically structures a processor or a computer, where the firmware is smaller in size than a typical application program, and is typically not very accessible to or modifiable by the user of a computer. Computer programs and firmware are often specified using source code written in a programming language, such as C. Modules, circuits, processors, programs, and computers can be specified at multiple levels of abstraction, for example, using the SystemC programming language, and have value as products in commerce as taxable goods under the Uniform Commercial Code (see U.C.C. Article 2, Part 1).

A program is transferred into one or more memories of the computer or computer system from a data and information device or storage system. A computer system typically has a device for reading storage media that is used to transfer the program, and/or has an interface device that receives the program over a network. This process is discussed in the General Computer Explanation section.

Detailed Description—Technology Support General Computer Explanation

Figure 8A:
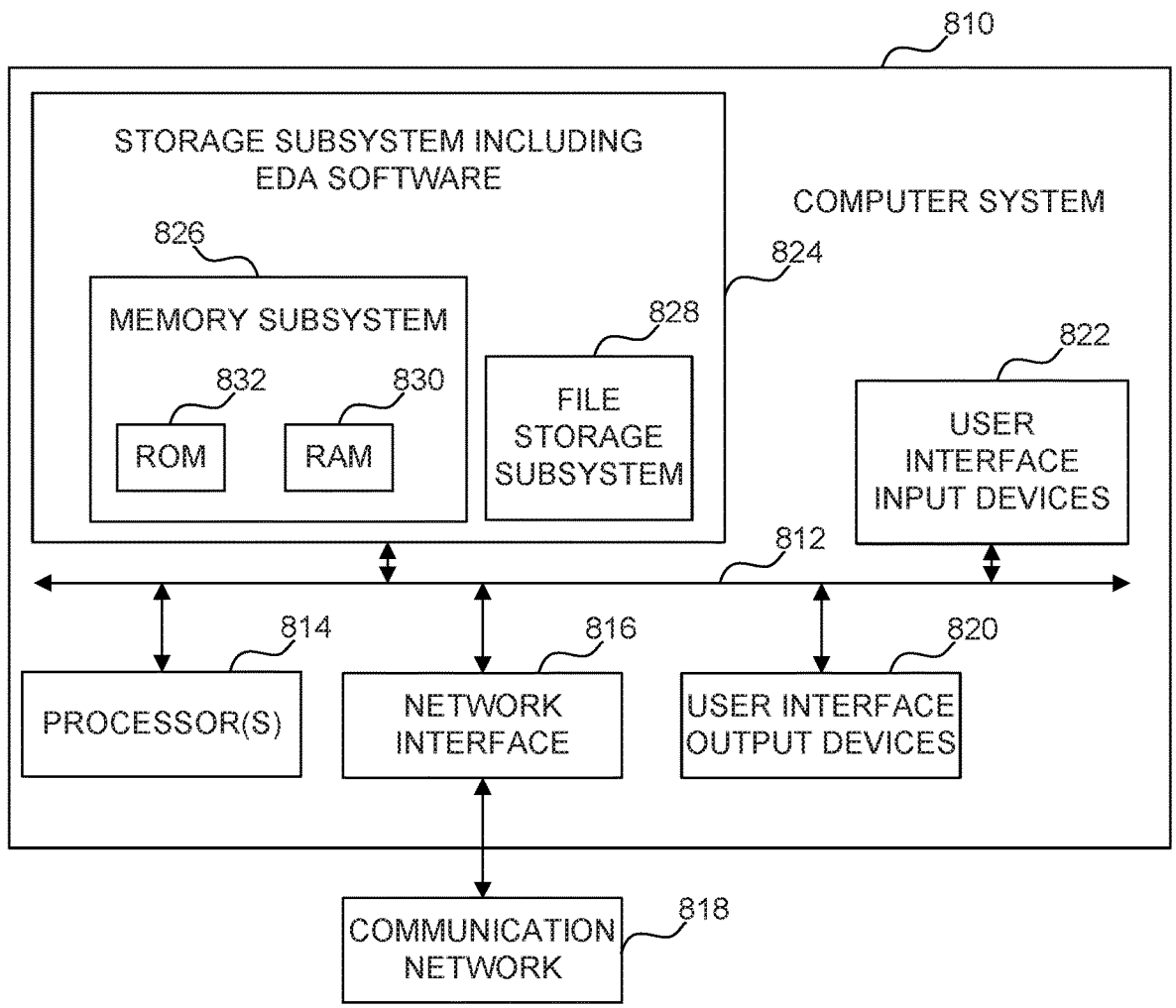
FIGS. 8A and 8B depict abstract diagrams of a computer system for use in commerce, if needed, by embodiments of the claimed inventions, as well as an embodiment of a circuit design and an embodiment of a manufactured circuit used these claimed inventions.
Figure 8B:
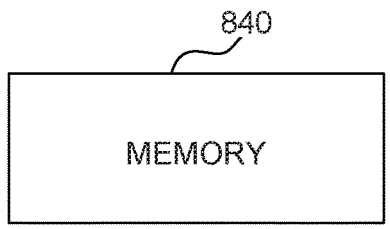

FIGS. 8A and 8B are abstract diagrams of a computer system suitable for enabling embodiments of the claimed inventions.

In FIG. 8A, the structure of computer system 810 typically includes at least one computer 814 which communicates with peripheral devices via bus subsystem 812. Typically, the computer includes a processor (e.g., a microprocessor, graphics processing unit, or digital signal processor), or its electronic processing equivalents, such as an Application Specific Integrated Circuit ('ASIC') or Field Programmable Gate Array ('FPGA'). Typically, peripheral devices include a storage subsystem 824, comprising a memory subsystem 826 and a file storage subsystem 828, user interface input devices 822, user interface output devices 820, and/or a network interface subsystem 816. The input and output devices enable direct and remote user interaction with computer system 810. The computer system enables significant post-process activity using at least one output device and/or the network interface subsystem.

The computer system can be structured as a server, a client, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine with instructions that specify actions to be taken by that machine. The term 'server', as used herein, refers to a computer or processor that typically performs processes for, and sends data and information to, another computer or processor.

A computer system typically is structured, in part, with at least one operating system program, such as Microsoft's Windows, Sun Microsystems's Solaris, Apple Computer's MacOs and iOS, Google's Android, Linux and/or Unix. The computer system typically includes a Basic Input/Output System (BIOS) and processor firmware. The operating system, BIOS and firmware are used by the processor to structure and control any subsystems and interfaces connected to the processor. Typical processors that enable these operating systems include: the Pentium, Itanium and Xeon processors from Intel; the Opteron and Athlon processors from Advanced Micro Devices; the Graviton processor from Amazon; the POWER processor from IBM; the SPARC processor from Oracle; and the ARM processor from ARM Holdings.

The claimed inventions and their embodiments are limited neither to an electronic digital logic computer structured with programs nor to an electronically programmable device. For example, the claimed inventions can use an optical computer, a quantum computer, an analog computer, or the like. Further, where only a single computer system or a single machine is signified, the use of a singular form of such terms also can signify any structure of computer systems or machines that individually or jointly use processes. Due to the ever-changing nature of computers and networks, the description of computer system 810 depicted in FIG. 8A is intended only as an example. Many other structures of computer system 810 have more or less components than the computer system depicted in FIG. 8A.

Network interface subsystem 816 provides an interface to outside networks, including an interface to communication network 818, and is coupled via communication network 818 to corresponding interface devices in other computer systems or machines. Communication network 818 can comprise many interconnected computer systems, machines and physical communication connections (signified by 'links'). These communication links can be wireline links, optical links, wireless links (e.g., using the WiFi or Bluetooth protocols), or any other physical devices for communication of information. Communication network 818 can be any suitable computer network, for example a wide area network such as the Internet, and/or a local-to-wide area network such as Ethernet. The communication network is wired and/or wireless, and many communication networks use encryption and decryption processes, such as is available with a virtual private network. The communication network uses one or more communications interfaces, which receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. Communication algorithms ('protocols') can be specified using one or communication languages, such as HTTP, TCP/IP, RTP/RTSP, IPX and/or UDP.

User interface input devices 822 can include an alphanumeric keyboard, a keypad, pointing devices such as a mouse, trackball, toggle switch, touchpad, stylus, a graphics tablet, an optical scanner such as a bar code reader, touchscreen electronics for a display device, audio input devices such as voice recognition systems or microphones, eye-gaze recognition, brainwave pattern recognition, optical character recognition systems, and other types of input devices. Such devices are connected by wire or wirelessly to a computer system. Typically, the term 'input device' signifies all possible types of devices and processes to transfer data and information into computer system 810 or onto communication network 818. User interface input devices typically enable a user to select objects, icons, text and the like that appear on some types of user interface output devices, for example, a display subsystem.

User interface output devices 820 can include a display subsystem, a printer, a fax machine, or a non-visual communication device such as audio and haptic devices. The display subsystem can include a cathode ray tube (CRT), a flat-panel device such as a liquid crystal display (LCD), an image projection device, or some other device for creating visible stimuli such as a virtual reality system. The display subsystem also can provide non-visual stimuli such as via audio output, aroma generation, or tactile/haptic output (e.g., vibrations and forces) devices. Typically, the term 'output device' signifies all possible types of devices and processes to transfer data and information out of computer system 810 to the user or to another machine or computer system. Such devices are connected by wire or wirelessly to a computer system. Note: some devices transfer data and information both into and out of the computer, for example, haptic devices that generate vibrations and forces on the hand of a user while also incorporating sensors to measure the location and movement of the hand. Technical applications of the sciences of ergonomics and semiotics are used to improve the efficiency of user interactions with any processes and computers disclosed herein, such as any interactions with regards to the design and manufacture of circuits, that use any of the above input or output devices.

Memory subsystem 826 typically includes a number of memories including a main random-access memory ('RAM') 830 (or other volatile storage device) for storage of instructions and data during program execution and a read only memory ('ROM') 832 in which fixed instructions are stored. File storage subsystem 828 provides persistent storage for program and data files, and can include a hard disk drive, a floppy disk drive along with associated removable media, a CD-ROM drive, an optical drive, a flash memory such as a USB drive, or removable media cartridges. If computer system 810 includes an input device that performs optical character recognition, then text and symbols printed on paper can be used as a device for storage of program and data files. The databases and modules used by some embodiments can be stored by file storage subsystem 828.

Bus subsystem 812 provides a device for transmitting data and information between the various components and subsystems of computer system 810. Although bus subsystem 812 is depicted as a single bus, alternative embodiments of the bus subsystem can use multiple busses. For example, a main memory using RAM can communicate directly with file storage systems using Direct Memory Access ('DMA') systems.

FIG. 8B depicts a memory 840 such as a non-transitory, processor readable data and information storage medium associated with file storage subsystem 828, and/or with network interface subsystem 816, and can include a data structure specifying a circuit design. The memory 840 can be a hard disk, a floppy disk, a CD-ROM, an optical medium, removable media cartridge, or any other medium that stores computer readable data in a volatile or non-volatile form, such as text and symbols on paper that can be processed by an optical character recognition system. A program transferred in to and out of a processor from such a memory can be transformed into a physical signal that is propagated through a medium (such as a network, connector, wire, or circuit trace as an electrical pulse); or through a medium such as space or an atmosphere as an acoustic signal, or as electromagnetic radiation with wavelengths in the electromagnetic spectrum longer than infrared light).

Detailed Description—Technology Support EDA System/Workflow Explanation

Figure 7:
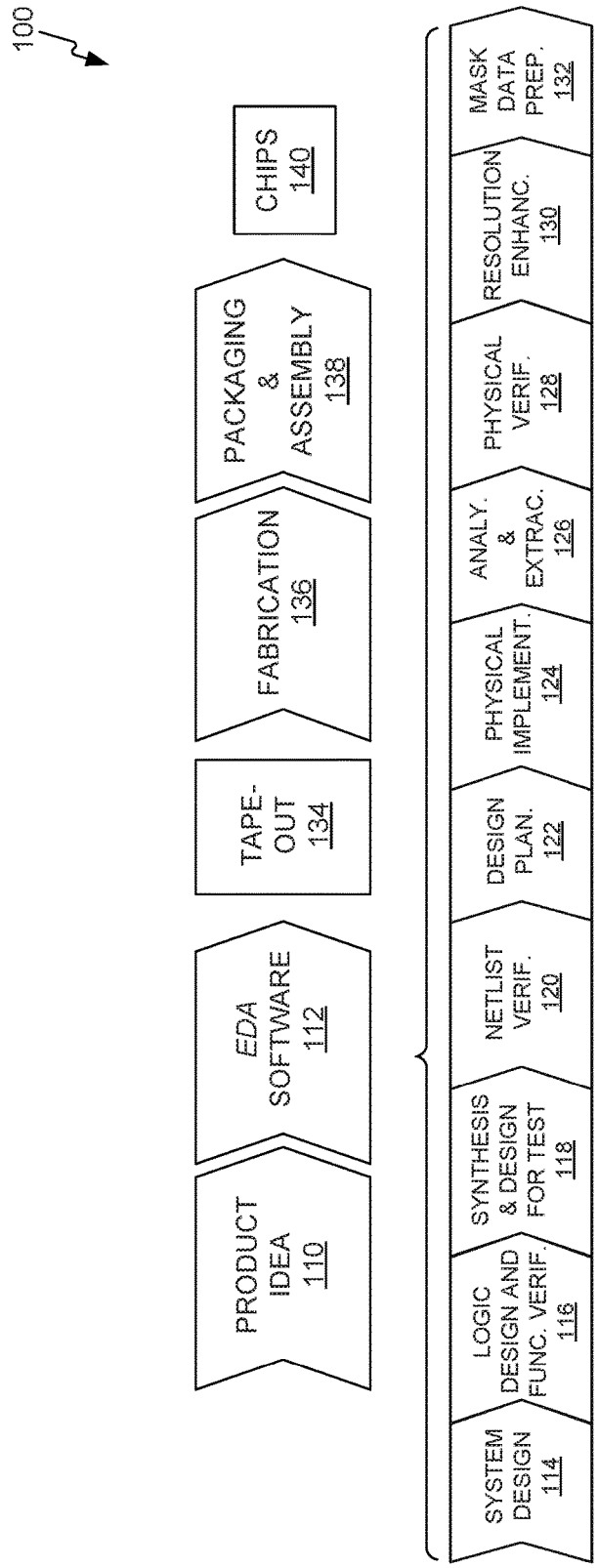
FIG. 7 depicts a flowchart of various processes used during the design and manufacture of an integrated circuit.

FIG. 7 depicts a set of processes 7-100 used during the design, verification and fabrication of an article of manufacture such as an integrated circuit to transform and verify design data and instructions that represent the integrated circuit. Each of these processes can be structured and enabled as multiple modules. The term 'EDA' signifies the term 'Electronic Design Automation'. These processes start with the creation of a product idea 7-110 with information supplied by a designer, information which is transformed to create an article of manufacture that uses a set of EDA processes 7-112. When the design is finalized, it is taped-out 7-134, which typically is when artwork (e.g., geometric patterns) for the integrated circuit is sent to a fabrication facility to manufacture the mask set, which is then used to manufacture the integrated circuit. After tape-out, a semiconductor die is manufactured 7-136 and packaging and assembly processes 7-138 are performed to produce the finished integrated circuit 7-140.

Specifications for a circuit or electronic structure are as used in commerce at multiple levels of useful abstraction ranging from low-level transistor material layouts to high-level description languages. Most designers start with a description using one or more modules with less detail at a high-level of abstraction to design their circuits and systems, using a hardware description language ('HDL') such as VHDL, Verilog, SystemVerilog, SystemC, MyHDL or OpenVera. The high-level description is easier for designers to understand, especially for a vast system, and can describe very complex systems that are difficult to understand using a lower level of abstraction that is a more detailed description. The HDL description can be transformed into other levels of abstraction that are used by the developers. For example, a high-level description can be transformed to a logic-level register transfer level ('RTL') description, a gate-level description, a layout-level description, or a mask-level description. Each lower abstraction level that is a less abstract description adds more useful detail into the design description, for example, more details for the modules that comprise the description. The lower-levels of abstraction that are less abstract descriptions can be generated by a computer, derived from a design library, or created by another design automation process. An example of a specification language at a lower level of abstraction language for specifying more detailed descriptions is SPICE, which is much used for detailed descriptions of circuits with many analog components. A circuit specification for a circuit also has value as an article of manufacture in commerce as a good under the Uniform Commercial Code (see U.C.C. Article 2, Part 1). Descriptions at each level of abstraction are enabled for use by the corresponding tools of that layer (for example, a formal verification tool), and some of the modules of the abstractions need not be novel or unobvious.

A design process that uses EDA processes 7-112 includes processes 7-114 to 7-132, which are described below. This design flow description is used only to illustrate, not to limit. For example, a designer of an integrated circuit design can use the design processes in a different sequence than the sequence depicted in FIG. 30. For the embodiments disclosed herein, products from Synopsys, Inc. of Mountain View, Calif. (hereinafter signified by 'Synopsys'), are used to enable these processes, and/or similar products from other companies.

During system design 7-114, a designer specifies the functionality to be manufactured. The designer also can optimize the power, performance and area (physical and/or lines of code) and minimize costs, etc. Partitioning of the design into different types of modules can occur at this stage. Exemplary EDA products from Synopsys that enable system design 7-114 include: the Model Architect, Saber, System Studio, and Designware products.

During logic design and functional verification 7-116, modules in the circuit are specified in one or more description languages, and the specification is checked for functional accuracy, that is, that the modules produce outputs that match the requirements of the specification of the circuit or system being designed. Exemplary HDL languages are Verilog, VHDL and SystemC. Functional verification typically uses simulators and other programs such as testbench generators, static HDL checkers and formal verifiers. In some situations, special systems of modules referred to as 'emulators' or 'prototyping systems' are used to speed up the functional verification. Exemplary EDA products from Synopsys that can be used at this stage include: VCS, Vera, Designware, Magellan, Formality, ESP and Leda products. Exemplary emulator and prototyping products available from Synopsys that enable logic design and functional verification 7-116 include: Zebu® and Protolink® (RTM signifies 'Registered Trademark').

During synthesis and design for test 7-118, HDL code is transformed to a netlist (which typically is a graph structure where the edges represent components of a circuit and where the nodes represent how the components are interconnected). Both the HDL code and the netlist are hierarchical articles of manufacture that can be used by an EDA product to verify that the integrated circuit, when manufactured, performs according to its design. This netlist can be optimized for a target semiconductor manufacturing technology. Additionally, the finished integrated circuit is tested to verify that it satisfies the requirements of the specification. Exemplary EDA products from Synopsys that enable synthesis and design for test 7-118 include: the Design Compiler, Physical Compiler, Test Compiler, Power Compiler, FPGA Compiler, Tetramax, and Designware products.

During netlist verification 7-120, the netlist is checked for compliance with timing constraints and for correspondence with the HDL code. Exemplary EDA products from Synopsys that enable netlist verification 7-120 include: the Formality, Primetime, and VCS products.

During design planning 7-122, an overall floor plan for the integrated circuit is constructed and analyzed for timing and top-level routing. Exemplary EDA products from Synopsys that enable design planning 7-122 include: the Astro and IC Compiler products.

During layout implementation 7-124, physical placement (positioning of circuit components such as transistors or capacitors) and routing (connection of the components by multiple conductors) occurs, and the selection of cells from a library to enable specific logic functions. As used herein, the term 'cell' signifies a set of transistors, other components, and interconnections that provides a Boolean logic function (e.g., AND, OR, NOT, XOR) or a storage function (such as a flipflop or latch). As used herein, a circuit 'block' comprises two or more cells. Both a cell and a circuit block can be referred to as a module, and are enabled as both physical structures and in simulations. Parameters are specified for selected cells (based on 'standard cells') such as size, and made accessible in a database for use by EDA products. Examples of databases that can be used for accessing cells include MySQL and PostgreSQL. Exemplary EDA products from Synopsys that enable layout implementation 7-124 include: the Astro and IC Compiler products.

During analysis and extraction 7-126, the circuit function is verified at the layout level, which permits refinement of the layout design. Exemplary EDA products from Synopsys that enable analysis and extraction 7-126 include: the Astrorail, Primerail, Primetime, and Star RC/XT products.

During physical verification 7-128, the layout design is checked to ensure that manufacturing constraints are correct, such as DRC constraints, electrical constraints, lithographic constraints, and that circuitry function matches the HDL design specification. Exemplary EDA products from Synopsys that enable physical verification 7-128 include: the Hercules product.

During resolution enhancement 7-130, the geometry of the layout is transformed to improve how the design is manufactured. Exemplary EDA products from Synopsys that enable resolution enhancement 7-130 include: the Proteus product.

During tape-out, data is created to be used (after lithographic enhancements are applied if appropriate) for production of lithography masks. Example EDA products from Synopsys that enable tape-out include: the IC Compiler and Custom Designer products.

During mask-data preparation 7-132, the 'tape-out' data is used to produce lithography masks that are used to produce finished integrated circuits. Exemplary EDA products from Synopsys that enable mask-data preparation 7-132 include: the CATS family of products.

For all of the abovementioned EDA products, similar products from other EDA vendors, such as Cadence, Siemens, other corporate entities or various non-commercial products from universities, or open source repositories, can be used as an alternative.

A storage subsystem of a computer system (such as computer system 810 of FIG. 8A) is preferably used to store the programs and data structures that are used by some or all of the EDA products described herein, and products used for development of cells for the library and for physical and logical design that use the library.

Detailed Description—Semantic Support

The signifier 'commercial solution' signifies, solely for the following paragraph, an engineering domain-specific (and thus non-preemptive—see Bilski): electronic structure, a process for a specified machine, a manufacturable circuit (and their Church-Turing equivalents) or a composition of matter that applies science and/or technology for use in commerce to solve a technical problem.

The signifier 'abstract' (when used in a patent claim for any enabled embodiments disclosed herein for a new commercial solution that is a scientific use of one or more laws of nature {see Benson}, and that solves a problem of technology {see Diehr} for use in commerce—or improves upon an existing solution used in commerce {see Diehr})—is precisely defined by the inventor(s) {see MPEP 2111.01 (9$^{th}$ edition, Rev. August 2017)} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is 'difficult to understand' {see Merriam-Webster definition for 'abstract'} how the commercial solution differs from equivalent prior art solutions; or b) a new commercial solution is 'abstract' if the existing prior art includes at least one analogous prior art solution {see KSR}, or the existing prior art includes at least two prior art publications that can be combined {see Alice} by a skilled person {often referred to as a 'PHOSITA', see MPEP 2141-2144 (9$^{th}$ edition, Rev. August 2017)} to be equivalent to the new commercial solution, and is thus unpatentable under 35 U.S.C. 103, for example, because it is 'difficult to understand' how the new commercial solution differs from a PHOSITA-combination/-application of the existing prior art; or c) a new commercial solution is 'abstract' if it is not disclosed with a description that enables its praxis, either because insufficient guidance exists in the description, or because only a generic implementation is described {see Mayo} with unspecified components, parameters or functionality, so that a PHOSITA is unable to instantiate an embodiment of the new solution for use in commerce, without, for example, requiring special programming {see Katz} (or, e.g., circuit design) to be performed by the PHOSITA, and is thus unpatentable under 35 U.S.C. 112, for example, because it is 'difficult to understand' how to use in commerce any embodiment of the new commercial solution.

Detailed Description—Definitions

As used herein, the semiotic function RUD(t,p1,p2, . . . ) signifies that a skilled person can obtain, if needed for progressing the useful arts, a reasonably useful definition of the signifier 't' that comprises the union of definitions of T in one or more U.S. patents and U.S. patent applications 'p1', 'p2', etc. For example, 'RUD(substantially,9532624)' signifies that a skilled person can obtain a reasonably useful definition of 'substantially' as it is defined in U.S. Pat. No. 9,532,624.

DEFINITIONS: RUD(Substantially,9532624).

Detailed Description—Conclusion

The Detailed Description signifies in isolation the individual features, structures, functions, or characteristics described herein and any combination of two or more such features, structures, functions or characteristics, to the extent that such features, structures, functions or characteristics or combinations thereof are enabled by the Detailed Description as a whole in light of the knowledge and understanding of a skilled person, irrespective of whether such features, structures, functions or characteristics, or combinations thereof, solve any problems disclosed herein, and without limitation to the scope of the Claims of the patent. When an embodiment of a claimed invention comprises a particular feature, structure, function or characteristic, it is within the knowledge and understanding of a skilled person to use such feature, structure, function, or characteristic in connection with other embodiments whether or not explicitly described, for example, as a substitute for another feature, structure, function or characteristic.

In view of the Detailed Description, a skilled person will understand that many variations of the claimed inventions can be enabled, such as function and structure of elements, described herein while remaining in the domain of the claimed inventions. One or more elements of an embodiment can be substituted for one or more elements in another embodiment, as will be understood by a skilled person. Writings about embodiments signify their uses in commerce, thereby enabling other skilled people to similarly use in commerce.

This Detailed Description is fitly written to provide knowledge and understanding. It is neither exhaustive nor limiting of the precise structures described, but is to be accorded the widest scope consistent with the disclosed principles and features. A skilled person can enable many equivalent variations. Without limitation, any and all equivalents described, signified or Incorporated By Reference in this patent application are specifically Incorporated By Reference into the Detailed Description. In addition, any and all variations described, signified or Incorporated By Reference with respect to any one claimed invention and its embodiment also are included with all other claimed inventions and their embodiments. Any such variations include both currently known variations as well as future variations, for example any element used for enablement includes a future equivalent element that provides the same function, regardless of the structure of the future equivalent element.

It is intended that the domain of the set of claimed inventions and their embodiments be defined and judged by the following Claims and their equivalents. The Detailed Description includes the following Claims, with each Claim standing on its own as a separate claimed invention. The embodiments of the claimed inventions can have more structure and features than are explicitly specified in the Claims.

What is claimed:

1. A system for application modeling framework, comprising:
   a user interface;
   a memory configured to store operations;
   one or more processors configured to perform the operations comprising:
      receiving, via the user interface, an application specification comprising an application algorithm;
      extracting from the application algorithm a first node and a second node, wherein the first node comprises a first component of the application algorithm, and the second node comprises a second component of the application algorithm, and wherein the first component is different from the second component;
      analyzing execution dependency of the first node on the second node comprising analyzing computational requirements, bandwidth requirements, and input trigger requirements of the first node and the second node based on parallelism of available resources;
      determining a plurality of application execution paths based on the analyzed execution dependency for the first node and the second node;
      simulating the plurality of application execution paths on a computational platform configured based on input received via the user interface;

based on the analyzed execution dependency of the first node on the second node and the simulation of the plurality of application execution paths, identifying a suggested node to be broken into two or more nodes, wherein the suggested node comprises the first node or the second node; and generating a report for display, the report comprising:
an analysis of the application algorithm based on simulation of the plurality of execution paths on the computational platform on the parallelism of the available resources, and
an identification of the suggested node to be broken into two or more nodes, wherein the suggested node is identified further based on specific communication channel information applied for token transportation between the plurality of nodes.

2. The system of claim 1, wherein the analyzing the execution dependency further comprises:
comparing performance of the application algorithm between concurrent data traffic at the first node at a first level and concurrent data traffic at the first node at a second level that is different from the first level.

3. The system of claim 1, wherein the analyzing the execution dependency further comprises:
analyzing additional delay and input-output traffic generated based on communication delay specified in communication delay information for inter-node communication between the first node and the second node to determine the parallelism of the available resources, wherein the communication delay information is received via the user interface.

4. The system of claim 1, wherein the analyzing the execution dependency further comprises:
analyzing capacity limitation and backpressure imposed on the parallelism of the available resources based on a communication channel specified in communication channel information for inter-node communication between the first node and the second node, wherein the communication channel information is received via the user interface, and the communication channel comprises one or more of a shared memory, a local memory, a network memory, a pipe, and a message queue.

5. The system of claim 1, wherein the analyzing the input trigger requirements comprises:
analyzing transportation of an output token from the first node to the second node over a communication channel to determine the parallelism of the available resources, wherein the communication channel comprises one or more of a shared memory, a local memory, a network memory, a pipe, and a message queue, and wherein the output token of the first node is an input token of the second node.

6. The system of claim 1, the operations further comprising:
identifying one or more nodes of the plurality of nodes to delay an application execution path of the plurality of application execution paths based on simulation of the plurality of execution paths on the computational platform corresponding to one of the computational requirements, the bandwidth requirements, and the input trigger requirements of one or more downstream nodes in the application execution path, wherein the one or more downstream nodes cause delay in the application execution path based on one of the computational requirements, the bandwidth requirements, and the input trigger requirements.

7. The system of claim 1, wherein the suggested node is identified further based on analysis of input trigger requirements of each node of a plurality of nodes.

8. A method for application modeling, comprising:
receiving, at one or more computing devices, an application specification comprising an application algorithm;
extracting, at the one or more computing devices, from the application algorithm a first node and a second node, wherein the first node comprises a first component of the application algorithm, and the second node comprises a second component of the application algorithm, and wherein the first component is different from the second component;
analyzing, at the one or more computing devices, execution dependency of the first node on the second node comprising analyzing computational requirements, bandwidth requirements, and input trigger requirements of the first node and the second node based on parallelism of available resources;
determining, at the one or more computing devices, a plurality of application execution paths based on the analyzed execution dependency for the first node and the second node;
simulating, at the one or more computing devices, the plurality of application execution paths on a computational platform configured based on input received via a user interface;
based on the analyzed execution dependency of the first node on the second node and the simulation of the plurality of application execution paths, identifying, at the one or more computing devices, a suggested node to be broken into two or more nodes, wherein the suggested node comprises the first node or the second node; and
generating, at the one or more computing devices, a report for display, the report comprising:
an analysis of the application algorithm based on simulation of the plurality of execution paths on the computational platform on the parallelism of the available resources, and
an identification of the suggested node to be broken into two or more nodes, wherein the suggested node is identified further based on specific communication channel information applied for token transportation between the plurality of nodes.

9. The method of claim 8, wherein the analyzing the execution dependency further comprising:
comparing, at the one or more computing devices, performance of the application algorithm between concurrent data traffic at the first node at a first level and concurrent data traffic at the first node at a second level that is different from the first level.

10. The method of claim 8, wherein the analyzing the execution dependency further comprising:
analyzing, at the one or more computing devices, additional delay and input-output traffic generated based on communication delay specified in communication delay information for inter-node communication between the first node and the second node to determine the parallelism of the available resources, wherein the communication delay information is received via the user interface.

11. The method of claim 8, wherein the analyzing the execution dependency further comprising:
analyzing, at the one or more computing devices, capacity limitation and backpressure imposed on the parallelism of the available resources based on a communication channel specified in communication channel information for inter-node communication between the first node and the second node, wherein the communication channel information is received via the user interface, and the communication channel comprises one or more of a shared memory, a local memory, a network memory, a pipe, and a message queue.

12. The method of claim 8, wherein the first node and the second node are schedulable and runnable entities on the computational platform, and wherein the first node sends a request for allocation of computational and input-output (I/O) resources corresponding to the computational requirements and the bandwidth requirements associated with the first node, and the second node sends a request for allocation of computational and input-output (I/O) resources corresponding to the computational requirements and the bandwidth requirements associated with the second node.

13. The method of claim 8, wherein the analyzing input trigger requirements comprises:
analyzing, at the one or more computing devices, transportation of an output token from the first node to the second node over a communication channel to determine the parallelism of the available resources, wherein the communication channel comprises one or more of a shared memory, a local memory, a network memory, a pipe, and a message queue, and wherein the output token of the first node is an input token of the second node.

14. The method of claim 8, further comprising:
identifying, at the one or more computing devices, one or more nodes of the plurality of nodes to delay an application execution path of the plurality of application execution paths based on simulation of the plurality of execution paths on the computational platform corresponding to one of the computational requirements, the bandwidth requirements, and the input trigger requirements of one or more downstream nodes in the application execution path, wherein the one or more downstream nodes cause delay in the application execution path based on one of the computational requirements, the bandwidth requirements, and the input trigger requirements.

15. The method of claim 8, wherein the suggested node is identified further based on analysis of input trigger requirements of each node of a plurality of nodes.

16. A non-transitory, tangible computer-readable device having instructions stored thereon that, when executed by at least one computing device, causes the at least one computing device to perform operations comprising:
receiving an application specification comprising an application algorithm;
extracting from the application algorithm a first node and a second node, wherein the first node comprises a first component of the application algorithm, and the second node comprises a second component of the application algorithm, and wherein the first component is different from the second component;
analyzing execution dependency of the first node on the second node comprising analyzing computational requirements, bandwidth requirements, and input trigger requirements of the first node and the second node based on parallelism of available resources;
determining a plurality of application execution paths based on the analyzed execution dependency for the first node and the second node;
simulating the plurality of application execution paths on a computational platform configured based on input received via a user interface;
based on the analyzed execution dependency of the first node on the second node and the simulation of the plurality of application execution paths, identifying, at the one or more computing devices, a suggested node to be broken into two or more nodes, wherein the suggested node comprises the first node or the second node; and
generating a report for display, the report comprising:
an analysis of the application algorithm based on simulation of the plurality of execution paths on the computational platform on the parallelism of the available resources, and
an identification of the suggested node to be broken into two or more nodes, wherein the suggested node is identified further based on specific communication channel information applied for token transportation between the plurality of nodes.

17. The non-transitory, tangible computer-readable device of claim 16, wherein for the analyzing the execution dependency, the operations further comprise:
comparing performance of the application algorithm between concurrent data traffic at the first node at a first level and concurrent data traffic at the first node at a second level that is different from the first level.

18. The non-transitory, tangible computer-readable device of claim 16, wherein for the analyzing the execution dependency, the operations further comprise:
analyzing additional delay and input-output traffic generated based on communication delay specified in communication delay information for inter-node communication between the first node and the second node to determine the parallelism of the available resources, wherein the communication delay information is received via the user interface; and
analyzing capacity limitation and backpressure imposed on the parallelism of the available resources based on a communication channel specified in communication channel information for inter-node communication between the first node and the second node, wherein the communication channel information is received via the user interface, and the communication channel comprises one or more of a shared memory, a local memory, a network memory, a pipe, and a message queue.

19. The non-transitory, tangible computer-readable device of claim 16, for the analyzing the input trigger requirements, the operations further comprise:
analyzing transportation of an output token from the first node to the second node over a communication channel to determine the parallelism of the available resources, wherein the communication channel comprises one or more of a shared memory, a local memory, a network memory, a pipe, and a message queue, and wherein the output token of the first node is an input token of the second node.

20. The non-transitory, tangible computer-readable device of claim 16, wherein the operations further comprise:
identifying one or more nodes of the plurality of nodes to delay an application execution path of the plurality of application execution paths based on simulation of the plurality of execution paths on the computational platform corresponding to one of the computational requirements, the bandwidth requirements, and the input trigger requirements of one or more downstream nodes in the application execution path, wherein the one or more downstream nodes cause delay in the application execution path based on one of the computational requirements, the bandwidth requirements, and the input trigger requirements.

* * * * *